(12) United States Patent
Jacquinot et al.

(10) Patent No.: US 6,302,765 B1
(45) Date of Patent: *Oct. 16, 2001

(54) PROCESS FOR MECHANICAL CHEMICAL POLISHING OF A LAYER IN A COPPER-BASED MATERIAL

(75) Inventors: Eric Jacquinot, Trosly Breuil; Pascal Letourneau, Cessy; Maurice Rivoire, Meylan, all of (FR)

(73) Assignee: Clariant (France) S.A., Puteaux (FR)

( * ) Notice: Subject to any disclaimer, the term of this patent is extended or adjusted under 35 U.S.C. 154(b) by 0 days.

This patent is subject to a terminal disclaimer.

(21) Appl. No.: 09/365,176

(22) Filed: Aug. 2, 1999

(30) Foreign Application Priority Data

Jul. 31, 1999 (FR) .................................................. 98 09873

(51) Int. Cl.$^7$ ........................................................ B24B 1/00
(52) U.S. Cl. .............................. 451/41; 451/36; 451/37; 451/28; 438/693; 51/308
(58) Field of Search ...................... 451/41, 36, 28, 451/37; 438/691, 692, 693; 51/308

(56) References Cited

U.S. PATENT DOCUMENTS

| | | | |
|---|---|---|---|
| 3,972,712 | * 8/1976 | Renschen ............................ | 75/157.5 |
| 4,626,607 | 12/1986 | Jacquinot et al. . | |
| 5,226,930 | 7/1993 | Sasaki . | |
| 5,262,354 | * 11/1993 | Cote et al. ............................ | 437/195 |
| 5,352,277 | * 10/1994 | Sasaki ...................................... | 106/6 |
| 5,476,606 | * 12/1995 | Brancaleoni et al. .............. | 252/79.1 |
| 5,525,191 | * 6/1996 | Maniar et al. ...................... | 156/636.1 |
| 5,575,885 | * 11/1996 | Hirabayashi et al. ............. | 156/626.1 |
| 5,614,444 | * 3/1997 | Farkas et al. ......................... | 437/225 |
| 5,622,525 | * 4/1997 | Haisma et al. ......................... | 451/41 |
| 5,695,384 | * 12/1997 | Beratan .................................. | 451/28 |
| 5,769,689 | * 6/1998 | Cossaboon et al. .................. | 451/41 |
| 5,804,513 | * 9/1998 | Sakatani et al. ...................... | 438/693 |
| 5,861,055 | * 1/1999 | Allman et al. .......................... | 106/3 |
| 5,891,205 | * 4/1999 | Picardi et al. ......................... | 51/308 |
| 5,897,375 | * 4/1999 | Watts et al. ........................... | 438/693 |
| 5,993,685 | * 11/1999 | Currie et al. ......................... | 252/79.1 |
| 6,027,669 | * 2/2000 | Muira et al. ......................... | 252/518.1 |
| 6,043,159 | * 3/2000 | Jacquinot et al. ................... | 438/693 |
| 6,046,110 | * 4/2000 | Hirabayashi et al. ............... | 438/693 |
| 6,126,518 | 10/2000 | Jacquinot et al. . | |
| 6,136,912 | 10/2000 | Jacquinot et al. . | |

FOREIGN PATENT DOCUMENTS

| | | | |
|---|---|---|---|
| 0 565 403 | 10/1993 | (EP) . | |
| 0 637 619 | 2/1995 | (EP) . | |
| 0 747 939 | 12/1996 | (EP) . | |
| 0 831 136 | 3/1998 | (EP) . | |
| 0 846 742 | 6/1998 | (EP) . | |
| 0838845 A1 | * 7/1997 | (FR) ...................................... | 438/693 |
| 2 754 937 | 4/1998 | (FR) . | |
| 411214387-A | * 8/1999 | (JP) . | |
| 2000114213-A | * 4/2000 | (JP) . | |

OTHER PUBLICATIONS

Carpio, Ronald et al., "Initial study on copper CMP slurry chemistries.", Thin Solid Films, vol. 266, No. 2, pp. 238–244 (1995).

* cited by examiner

Primary Examiner—Lee Young
Assistant Examiner—Minh Trinh
(74) Attorney, Agent, or Firm—Browdy and Neimark

(57) ABSTRACT

Process for mechanical chemical polishing of a layer in a copper-based material using a polishing composition, characterized in that said polishing composition comprises an aqueous suspension of individualized colloidal silica particles not linked to each other by siloxane bonds, the average diameter of which is comprised between 10 and 100 nm, the pH of the aqueous suspension being comprised between 1 and 5.

17 Claims, 1 Drawing Sheet

PROCESS FOR MECHANICAL CHEMICAL POLISHING OF A LAYER IN A COPPER-BASED MATERIAL

The present invention relates to a process for mechanical chemical polishing of a layer in copper-based material, in particular for the formation of interconnecting tracks of integrated circuits.

The interconnecting tracks of semi-conductors are usually made from an aluminium film approximately 1 µm thick by lithography, then by reactive ionic etching (RIE). They are subsequently encapsulated in a dielectric layer, most often based on silicon oxide, obtained for example by decomposition in the vapour phase of tetraethylorthosilicate (TEOS).

The increase in the number of transistors per unit area, also called the integration density, necessitates the reduction of the width of the interconnecting tracks. This results in an increase in the electrical resistance of these interconnecting tracks as well as electromigration phenomena.

An advantage of copper over aluminium is that it gives a better resistance to electromigration. Moreover, its specific resistance is lower than that of aluminium. It thus appears to constitute an advantageous replacement for aluminium as a constituent of interconnecting tracks of integrated circuits.

Currently, it is difficult to etch the interconnecting tracks in copper by reactive ionic etching (RIE).

The damascene process is currently the best alternative known for defining interconnecting tracks in copper. The damascene process consists of depositing a silicon oxide based dielectric layer on a substrate. This dielectric layer can be obtained, for example, by the decomposition of TEOS in vapour phase. In general, the dielectric layer has a thickness of approximately 2 µm. The design of the interconnecting circuit is then transferred onto this dielectric layer by photolithography and then by reactive ionic etching (RIE). In general, this is etched such that trenches of a depth of approximately one µm are formed.

Subsequently, a diffusion barrier approximately 100 nm thick is generally deposited on the dielectric layer. This diffusion barrier prevents the diffusion of copper in the dielectric material. The diffusion barrier is usually composed of titanium or titanium nitride (TiN). A layer in a copper-based material approximately 2 µm thick is then deposited. The copper-based material can be elemental copper or copper alloys, in particular Cu—Si, Cu—Al, Cu—Si—Al or Cu—Ag.

The copper-based material must be polished by mechanical chemical polishing until the surface of the silicon oxide-based dielectric layer is reached. The copper-based material thus only remains in the trenches.

Figure 1:
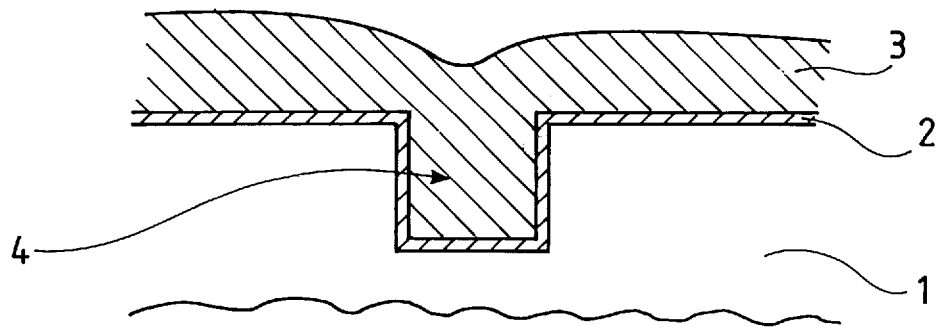
Figure 2:
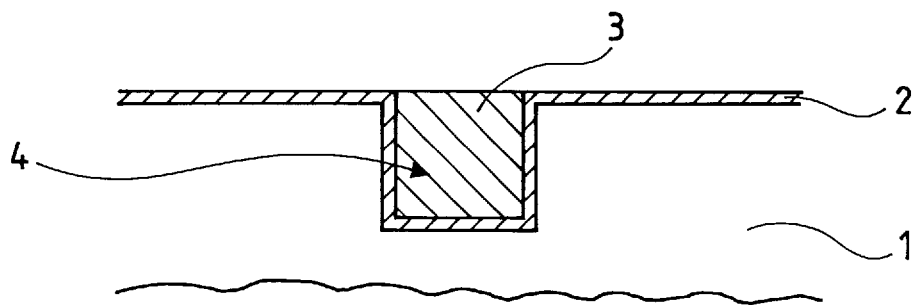

The damascene process is illustrated by FIGS. 1 and 2. More particularly, FIG. 1 represents a transverse section of an interconnecting track of an integrated circuit before mechanical chemical polishing. This transverse section includes a layer 1 in a dielectric material in which a trench 4 is etched. A layer 2 constituting a diffusion barrier is deposited on the layer 1, this layer 2 being itself covered by a layer 3 in a copper-based material. FIG. 2 represents a transverse section of an interconnecting track of the same integrated circuit after mechanical chemical polishing, the latter having been carried out in an ideal manner.

To carry out mechanical chemical polishing of the copper-based layer, two phenomena must be avoided:

an attack on the subjacent silicon oxide layer generally referred to as an erosion phenomenon. The consequence of this is the introduction locally of ridges, which is counter-productive to the desired planarization.

an over-polishing of the interconnecting tracks in the trenches generally referred to as a "dishing" phenomenon. This phenomenon also leads to the introduction of ridges and moreover, reduces the thickness of the interconnecting tracks and, as a result of this, reduces their conductance.

Figure 3:
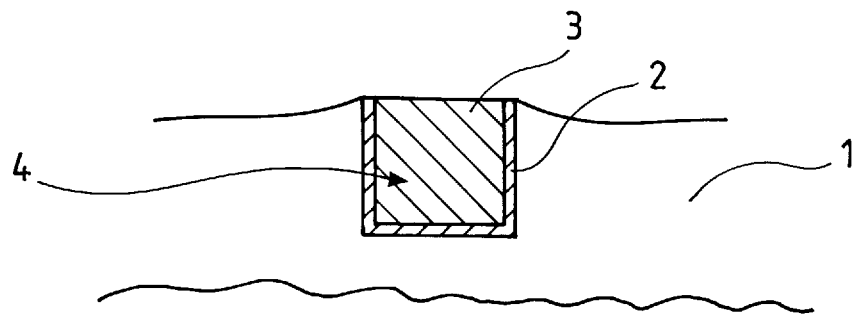
Figure 4:
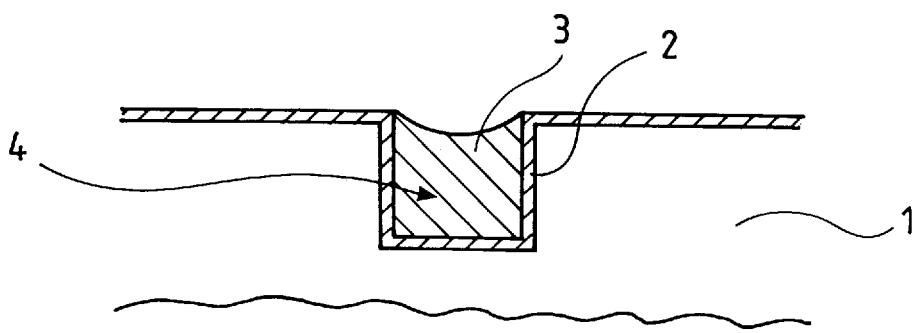

The two phenomena mentioned above are illustrated by FIGS. 3 and 4. More particularly, FIG. 3 represents a transverse section of an interconnecting track of the integrated circuit illustrated in FIG. 1 after polishing having led to an erosion phenomenon. FIG. 4 represents a transverse section of an interconnecting track of the integrated circuit illustrated in FIG. 1 after polishing having led to a dishing phenomenon.

The two phenomena of erosion and dishing are principally due to a poor uniformity of polishing of the copper-based material. In fact, an imperfect elimination of the copper-based layer necessitates a significant over-polishing to avoid all risk of electric continuity between the electronic devices. This results in an over-polishing of the interconnecting tracks and the dielectric areas already uncovered.

In the patent U.S. Pat. No. 5.622.525, a process is proposed for polishing surfaces in copper or alloys mainly containing copper using a polishing composition comprising a suspension of colloidal silica particles in an alkaline solution, demineralized water and a chemical activator. The silica particles have an average diameter comprised between 20 and 50 nm.

The patent U.S. Pat. No. 5,575,885 describes a polishing solution for a copper or copper alloy film comprising an organic acid chosen from aminoacetic acid and aminosulphuric acid, an oxidant like hydrogen peroxide or sodium hypochlorite, and water. The polishing solution can in addition comprise abrasive grains chosen from silica, zircon, cerium and aluminium oxide. These abrasive grains have an average grain size comprised between 20 and 100 nm. The alkaline solution has a neutral pH or preferably an alkaline pH comprised between 9 and 14.

Another copper or copper-based alloy polishing composition was described in the patent application EP-A-0 747 939. This polishing composition comprises water-soluble organic acids capable of forming complexes with copper, abrasive polishing grains and water. The abrasive grains are chosen from the group constituted by silica, zircon, cerium and aluminium oxide. The average diameter of these grains is comprised between 20 and 100 nm.

The copper or copper-alloy polishing processes currently lead to a poor polishing uniformity, particularly with the basic abrasives generally used.

A first subject of the invention thus consists of a mechanical chemical polishing process which allows a homogeneous and regular elimination of a copper-based material.

Another subject of the invention consists of a process for forming interconnections in a copper-based material in integrated circuits, avoiding the phenomena of dishing or erosion.

Yet another subject of the invention consists of the use of a colloidal silica based polishing composition for polishing a copper-based material.

Thus, the invention relates to a process for mechanical chemical polishing of a layer of copper-based material by a polishing composition, characterized in that said polishing composition comprises an aqueous suspension of individualized colloidal silica particles not linked to each other by siloxane bonds the average diameter of which is comprised between 10 and 100 nm, preferably between 25 and 50 nm, the pH of this aqueous suspension being comprised between 1 and 5.

It was noted by the inventors that the application of a polishing composition comprising colloidal silica particles not linked to each other by siloxane bonds and the average diameter of which is comprised between 10 and 100 nm, preferably between 25 and 50 nm and the pH of which is comprised between 1 and 5, allows an excellent compromise to be obtained between the polishing speed of the copper layer, the percentage uniformity of polishing and a satisfactory surface state.

The acid aqueous suspensions of colloidal silica used in the process of the invention can be obtained either from alkaline silicates, in particular sodium or potassium silicates, or from ethyl silicate. Such processes are more particularly described in K. K. Iler, "The Chemistry of Silica", ch.9, pp. 331–343, Ed. Wiley Interscience, 1979. The colloidal silica particles obtained according to this process are present in the form of individualized particles not linked to each other by siloxane bonds.

The pH of the aqueous suspension of colloidal silica particles is preferably comprised between 2 and 3.5.

According to an advantageous aspect of the invention, the colloidal silica particles have an average diameter comprised between 10 and 100 nm, preferably comprised between 25 and 50 nm and most particularly an average diameter of 35 nm.

According to another advantageous aspect of the invention, the colloidal silica particles are "monodispersed". By this term is understood within the scope of the present invention that 80%, preferably 90% of the colloidal silica particles used have the same determined diameter, give or take 10%, preferably give or take 5%. By way of example, the monodispersed colloidal silica particles of 35 nm in diameter consist of particles of which at least 80%, preferably 90% have a diameter of 35±3.5 nm, preferably a diameter of 35±1.75 nm.

The polishing composition used in the scope of the process of the invention can comprise more than 20% weight, preferably 30 to 40% by weight of colloidal silica particles.

Although very good polishing results can be obtained by a polishing composition comprising only colloidal silica particles suspended in water, it is not ruled out that this composition can contain other compounds usually used in polishing copper-based materials. These compounds can in particular consist of an oxidizing agent such as hydrogen peroxide or organic acids, in particular copper complexing organic acids such as those cited in the patent U.S. Pat. No. 5,575,885 and in the patent application EP-A-747,939.

According to another aspect, the invention relates to a process for producing interconnecting tracks in a copper-based material in integrated circuits according to which the following steps are carried out:

a silicon oxide based dielectric layer is deposited on a substrate, the trenches of an interconnecting circuit are etched on the surface of the dielectric layer, if necessary, a diffusion barrier is deposited on the dielectric layer, a layer of copper-based material is deposited on the dielectric layer or, if necessary, on the diffusion barrier, the layer based on a material containing copper is polished by mechanical chemical polishing, this process being characterized in that the mechanical chemical polishing of the copper-based material is carried out by a polishing composition comprising a suspension of individualized colloidal silica particles not linked to each other by siloxane bonds, said particles having an average diameter comprised between 10 and 100 nm, preferably between 25 and 50 nm, and the pH of the aqeuous suspension being comprised between 1 and 5, preferably between 2 and 3.5.

In the present description, the copper-based material can consist of elemental copper or a copper alloy chosen from the group constituted by the alloys of Cu—Si, Cu—Al, Cu—Si—Al and Cu—Ag.

The purpose of the following examples is simply to illustrate the present invention. In these examples, cards are used on which a copper layer approximately 1 $\mu$m thick was deposited. The copper layer was then polished on a PRESI M 550 polisher under the following conditions:

| | |
|---|---|
| applied pressure | 0.25 daN/cm$^2$ (1 daN/cm$^2$ = 10$^5$Pa) |
| plate speed | 30 rpm |
| head speed | 30 rpm |
| temperature | 20° C. |
| abrasion rate | 250 cm$^3$/mn |
| fabric | IC 1400 K with furrows from Rodel Products |

The following three types of test were then carried out:

a) Test of the speed of attack on the copper layer by the polishing composition. The speed of the attack was measured by the difference in thickness before and after polishing per minute of polishing on the copper plate. The speed of attack is expressed in Å/min.

b) Test of the uniformity of attack of polishing (U) The uniformity of attack was determined from the difference in thickness of copper at different points of the same plate. It is calculated from copper measurements on the same plate before and after polishing, using the following formula:

$$U = \frac{\text{max. thickness} - \text{min. thickness}}{2 \times \text{average thickness removed}} \times 100$$

In this formula, the maximum thickness and minimum thickness are determined by the measurement of the thickness at 49 different points in the copper layer after treatment of the latter. The maximum thickness corresponds to the largest thickness measured, the minimum thickness corresponds to the smallest thickness measured. The average thickness removed is the difference between the average thickness before polishing and the average thickness after polishing, these averages being calculated from the measurement at 49 points.

c) Visual observation test under an optical microscope to detect possible grooves on the plate and their magnitude.

EXAMPLE 1

A copper layer placed on a plate was then polished under the above-mentioned conditions using a polishing composition comprising an aqueous suspension of individualized colloidal silica particles not linked to each other by siloxane bonds, the characteristics of which are as follows:

| | |
|---|---|
| pH of the aqueous suspension | 2.5 |
| average diameter of the colloidal silica particles | 35 nm |
| concentration by weight of colloidal silica | 30% |

This polishing composition allowed the following results to be obtained:

a polishing speed of 1800 Å/mn a uniformity percentage of 8% no grooves observed under the optical microscope.

EXAMPLE 2

Under the same conditions as previously, the copper layer was then polished by a polishing composition comprising an aqueous colloidal silica suspension the characteristics of which are:

| | |
|---|---|
| pH of the aqueous suspension | 2.5 |
| average diameter of the colloidal silica particules | 50 nm |
| concentration by weight in colloidal silica | 30% |

The results obtained are as follows:

a polishing speed of 800 Å/mn a uniformity percentage of 11% some slight grooves observed under the optical microscope.

EXAMPLE 3 (COMPARATIVE)

Under the same conditions as in Example 1, a copper layer was then polished using a polishing composition comprising an aqueous suspension of colloidal silica the characteristics of which are as follows:

| | |
|---|---|
| pH of the aqueous suspension | 11 |
| average diameter of the colloidal silica particules | 50 nm |
| concentration by weight of colloidal silica | 30% |

The pH of the aqueous solution was adjusted to the desired value using ammonium hydroxide.

The results obtained were as follows:

a polishing speed of 700 Åmn a uniformity percentage of 40% a multitude of fine grooves visible to the naked eye.

The polishing compositions used in Examples 1 to 3 contained neither an oxidizing agent nor a copper complexing or non copper complexing organic acid. They also did not contain a surfactant.

The polishing compositions according to the invention allowed the homogeneous and regular elimination of copper while avoiding the appearance of grooves. With these polishing compositions, no dishing or erosion phenomena were observed.

On the contrary, the polishing composition of Comparative Example 3, the pH of which is basic, does not lead to a uniform polishing of the copper layer. The difficulties of significantly over-polishing this copper layer in order to ensure the absence of copper residue on the higher areas of the dielectrics led to an increase in dishing of the copper tracks as well as an erosion of the dielectric.

These examples show that a polishing composition comprising an aqueous suspension of individualized colloidal silica particles not linked to each other by siloxane bonds, of a diameter comprised between 10 and 100 nm, more particularly between 25 and 50 nm and which, simultaneously, has a lower pH than 5, allows a high-quality polishing of layers of a copper-based material. The combination of these factors allows a good compromise to be obtained between the polishing speed, the uniformity percentage and a satisfactory state of the treated copper plate, allowing in particular the creation of interconnecting tracks in a copper-based material in integrated circuits.

What is claimed is:

1. Process for mechanical chemical polishing of a copper-based material used in the semi-conductors electronics industry as a material constituting interconnecting tracks of integrated circuits, comprising polishing said copper-based material with an aqueous suspension of individualized colloidal silica particles not linked to each other by siloxane bonds, the average elemental particle diameter of which is between 10 and 100 nm, the pH of the aqueous suspension being between 1 and 5.

2. Process according to claim 1, wherein said polishing is carried out with the pH between 2 and 3.5.

3. Process according to claim 1, wherein said polishing is carried out with the average diameter of the colloidal silica particles between 25 and 50 nm.

4. Process according to claim 1, wherein said polishing is carried out with the average diameter of the elemental colloidal silica particles being approximately 35 nm.

5. Process according to claim 1, wherein said polishing is carried out with the colloidal silica particles being monodispersed.

6. Process according to claim 1, wherein said polishing is carried out with the suspension comprising more than 20% by weight of said colloidal silica particles.

7. Process according to claim 1, wherein said polishing is carried out with the copper-based material consisting essentially of elemental copper.

8. Process according to claim 1, wherein said polishing is carried out with the copper-based material being a copper alloy selected from the group consisting of the alloys Cu—Si, Cu—Al, Cu—Ai—Al and Cu—Ag.

9. Process according to claim 2, wherein said polishing is carried out with the average diameter of the colloidal silica particles being between 25 and 50 nm.

10. Process according to claim 9, wherein said polishing is carried out with the colloidal silica particles being monodispersed.

11. Process according to claim 10, wherein said polishing is carried out with the suspension comprising more than 20% by weight of colloidal silica particles.

12. Process according to claim 11, wherein said polishing is carried out with the suspension comprising 30–40% by weight of said colloidal silica particles.

13. Process according to claim 1, wherein said polishing is carried out with the suspension comprising 30–40% by weight of colloidal silica particles.

14. Process according to claim 12, wherein said polishing is carried out with the copper-based material being a copper alloy selected from the group consisting of the alloys Cu—Si, Cu—Al, Cu—Ai—Al and Cu—Ag.

15. Process according to claim 12, wherein said polishing is carried out with the copper-based material consisting essentially of elemental copper.

16. Process for producing interconnecting tracks in a copper-based material in integrated circuits according to which the following steps are carried out:

a silicon oxide based dielectric layer is deposited on a substrate, trenches of an interconnecting circuit are etched on the surface of the dielectric layer, a diffusion barrier is optionally deposited on the dielectric layer, a layer of copper-based material is deposited on the dielectric layer or optionally, on the diffusion barrier, the layer of copper-based material is polished by mechanical chemical polishing, wherein the mechanical chemical polishing of the copper-based material is carried out using a polishing composition comprising a suspension of individualized colloidal silica particles not linked to each other by siloxane bonds, said particles having an average diameter between 10 and 100 nm and the pH of the aqueous suspension being comprised between 1 and 5.

17. In a method of using a polishing composition comprising polishing a copper-based material with a polishing composition, the improvement wherein said polishing composition comprises a suspension of individualized colloidal silica particles not linked to each other by siloxane bonds, said particles having an average elemental particle diameter between 10 and 100 nm, and the pH of the aqueous suspension being between 1 and 5.

* * * * *